(12) United States Patent
Lo

(10) Patent No.: US 7,745,260 B2
(45) Date of Patent: Jun. 29, 2010

(54) METHOD OF FORMING SEMICONDUCTOR PACKAGE

(75) Inventor: Wai Yew Lo, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 171 days.

(21) Appl. No.: 12/234,709

(22) Filed: Sep. 22, 2008

(65) Prior Publication Data

US 2010/0075462 A1    Mar. 25, 2010

(51) Int. Cl.
*H01L 21/00* (2006.01)
(52) U.S. Cl. ............................ 438/110; 257/E33.066
(58) Field of Classification Search ......... 438/106–110, 438/124–127, 612–617; 257/E33.066
See application file for complete search history.

(56) References Cited

U.S. PATENT DOCUMENTS

| | | | |
|---|---|---|---|
| 4,259,436 A | 3/1981 | Tabuchi | |
| 6,100,112 A | 8/2000 | Amano | |
| 6,344,688 B1 | 2/2002 | Wang | |
| 6,911,729 B1 | 6/2005 | Chikawa | |
| 7,315,086 B2 | 1/2008 | Kim | |
| 2002/0000829 A1* | 1/2002 | Akram et al. | 324/765 |
| 2008/0199980 A1* | 8/2008 | Okayama | 438/16 |

* cited by examiner

*Primary Examiner*—Brook Kebede
(74) *Attorney, Agent, or Firm*—Charles Bergere

(57) ABSTRACT

A method of forming a semiconductor package (10) including forming a plurality of cavities (14) in a substrate (12). An electrically conductive pattern (16) is formed on the substrate (12) and over the cavities (14). An electrically insulating layer (22) is formed over the substrate (12) and the electrically conductive pattern (16). A plurality of vias (24) is formed in the electrically insulating layer (22). An integrated circuit (IC) die (28) is attached to the electrically insulating layer (22) and electrically connected to the vias (24) such that the IC die (28) is connected to the electrically conductive pattern (16). A molding operation is performed to encapsulate the IC die (28). The substrate (12) is removed such that the electrically conductive pattern (16) is exposed.

20 Claims, 3 Drawing Sheets and over the cavities 14. The electrically conductive pattern 16 includes a plurality of traces 18 and a plurality of conductive bumps 20, each of the conductive bumps 20 corresponding to respective ones of the cavities 14.

METHOD OF FORMING SEMICONDUCTOR PACKAGE

BACKGROUND OF THE INVENTION

The present invention relates to the packaging of semiconductor devices and more particularly to a method of forming a semiconductor package.

Miniaturization is a continuing trend in the production of electronic products and devices as smaller and lighter electronic products and devices are more desired than their larger and heavier counterparts, the former being easier to transport around or store and more convenient to use. Consequently, it would be advantageous to be able to fabricate semiconductor packages with high input/output (IO) densities to facilitate the miniaturization of electronic products and devices.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures, in which like references indicate similar elements.

DETAILED DESCRIPTION OF THE PREFERRED EMBODIMENTS

Figure 1:
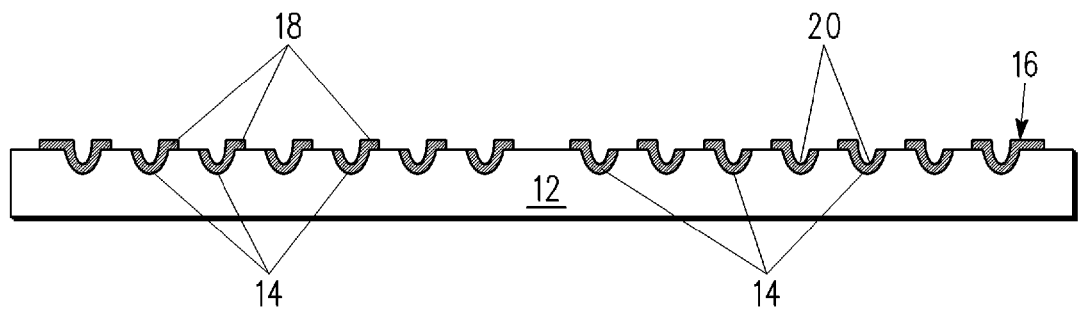
FIG. 1 is an enlarged cross-sectional view of a substrate with an electrically conductive pattern formed thereon in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of forming a semiconductor package including the step of forming a plurality of cavities in a substrate. An electrically conductive pattern is formed on the substrate and over the cavities. An electrically insulating layer is formed over the substrate and the electrically conductive pattern. A plurality of vias is formed in the electrically insulating layer. An integrated circuit (IC) die is attached to the electrically insulating layer and electrically connected to the vias such that the IC die is connected to the electrically conductive pattern. A molding operation is performed to encapsulate the IC die. The substrate is removed such that the electrically conductive pattern is exposed.

The present invention also provides a method of forming a plurality of semiconductor packages including the step of forming a plurality of cavities in a substrate. An electrically conductive pattern is formed on the substrate and atop the cavities. An electrically insulating layer is formed over the substrate and the electrically conductive pattern. A plurality of vias is formed in the electrically insulating layer. A plurality of integrated circuit (IC) dice is attached to the electrically insulating layer and electrically connected to the vias such that the IC dice are connected to the electrically conductive pattern. A molding operation is performed to encapsulate the IC dice. The substrate is subsequently removed such that the electrically conductive pattern is exposed.

The present invention also provides a semiconductor package including an electrically insulating layer having a plurality of vias formed therein. An electrically conductive pattern is formed on a first surface of the electrically insulating layer. An integrated circuit (IC) die is attached to a second surface of the electrically insulating layer and electrically connected to the vias in the electrically insulating layer such that the IC die is connected to the electrically conductive pattern. The IC die and a portion of the second surface of the electrically insulating layer are encapsulated by a mold compound. The electrically conductive pattern may include a plurality of traces and a plurality of conductive bumps. The conductive bumps may be located on a central portion and a peripheral portion of the semiconductor package. A portion of the traces may extend between respective ones of the vias and respective ones of the conductive bumps located on the central portion of the semiconductor package. A second electrically insulating layer may be formed over the traces.

FIGS. 1 through 5 illustrate a method of forming a plurality of semiconductor packages 10 in accordance with an embodiment of the present invention.

Referring now to FIG. 1, a substrate 12 having a plurality of cavities 14 formed therein is shown. An electrically conductive pattern 16 is formed on the substrate 12 and atop or over the cavities 14. The electrically conductive pattern 16 includes a plurality of traces 18 and a plurality of conductive bumps 20, each of the conductive bumps 20 corresponding to respective ones of the cavities 14.

The substrate 12 may comprise an electrically conductive material such as, for example, a strip of copper (Cu) foil or sheet and may have a thickness of between about 0.1 millimeter (mm) and about 1.0 mm. Nonetheless, it should be understood that the invention is not limited by the thickness of the substrate 12.

The cavities 14 may be formed in the substrate 12 in accordance with a predetermined land pattern for the semiconductor packages 10. In the embodiment shown, the cavities 14 are formed in a full area array layout on the substrate 12. That is, the cavities 14 are formed in regions of the substrate 12 corresponding to both central and peripheral portions of the semiconductor packages 10. Nonetheless, it should be understood that the present invention is not limited to the layout as described. In alternative embodiments, the cavities 14 may, for example, be formed in a peripheral array layout on the substrate 12, that is, only in regions of the substrate 12 corresponding to the peripheral portions of the semiconductor packages 10. In one embodiment, the cavities 14 may have a pitch of between about 0.1 mm and about 1.0 mm. Nonetheless, it should be understood that the invention is not limited by the pitch between the cavities 14.

The cavities 14 may be formed in the substrate 12 by applying a resist coating or laminating a dry film onto a surface of the substrate 12, exposing and developing the resist or dry film to form a patterned resist or dry film with the desired land pattern, and thereafter etching the substrate 12 using the patterned resist or dry film as an etching mask. Subsequent to the etching of the substrate 12, the patterned resist or dry film is stripped away. As solder resist coating, dry film lamination and chemical etching technologies are well known in the art of substrate manufacturing, further description of the formation of the cavities 14 in the substrate 12 is not required for a complete understanding of the present invention. In one embodiment, the cavities 14 may be formed in the substrate 12 to a depth of between about 100 microns (μm) and about 1000 μm. Nonetheless, it should be understood that the invention is not limited by the depth to which the cavities 14 are formed.

The electrically conductive pattern 16 may be formed on the substrate 12 by depositing an electrically conductive material such as, for example, gold, nickel or copper onto the substrate 12 via an electroplating process and subsequently patterning the electrically conductive material to form the traces 18 and the conductive bumps 20. Because metal buildup technologies such as electroplating are well known in the art of substrate manufacturing, further description of the formation of the electrically conductive pattern 16 on the substrate 12 is not required for a complete understanding of the present invention.

Figure 2:
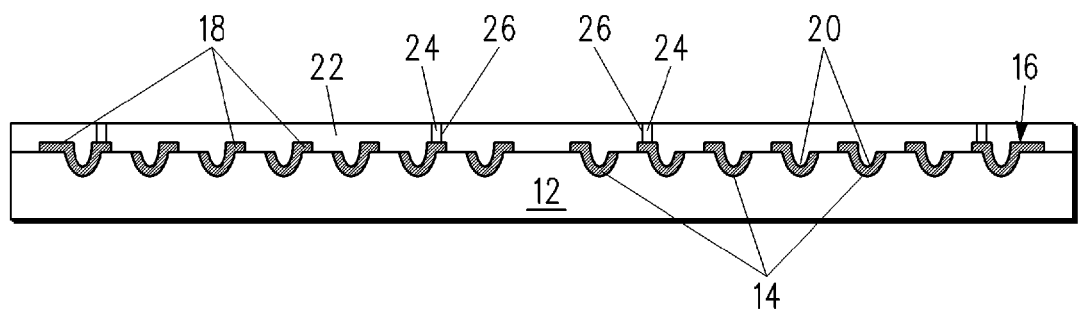
FIG. 2 is an enlarged cross-sectional view showing an electrically insulating layer formed over the substrate and the electrically conductive pattern of FIG. 1.

Referring now to FIG. 2, an electrically insulating layer 22 is formed over the substrate 12 and the electrically conductive pattern 16 of FIG. 1 as shown. A plurality of vias 24 is formed in the electrically insulating layer 22. More particularly, a plurality of through-holes 26 is formed through the electrically insulating layer 22 to the electrically conductive pattern 16. Thereafter, the through-holes 26 are plated with an electrically conductive material to form the vias 24.

In one embodiment, the electrically insulating layer 22 may comprise a solder resist layer and may be formed over the substrate 12 and the electrically conductive pattern 16 by, for example, film lamination. The through-holes 26 may be formed in the electrically insulating layer 22 by an exposure, development and thermal curing process or a laser blind via drilling process, both of which are known in the art. The through-holes 26 may be plated with gold (Au), for example, or other electrically conductive material using a known electrolytic plating process.

Figure 3:
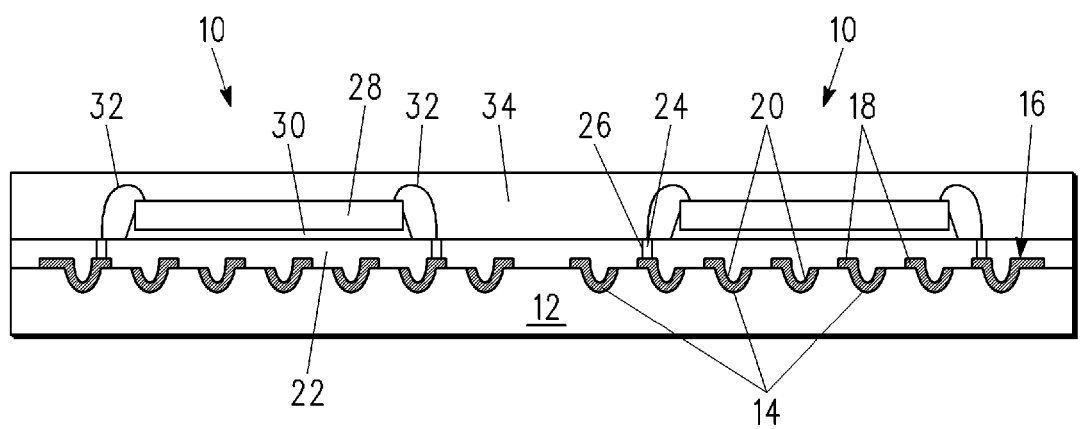
FIG. 3 is an enlarged cross-sectional view of a plurality of semiconductor packages formed in accordance with an embodiment of the present invention.

Referring now to FIG. 3, a plurality of integrated circuit (IC) dice 28 is attached to the electrically insulating layer 22 of FIG. 2 and electrically connected to the vias 24 as shown. More particularly, the IC dice 28 are attached to respective die attach areas on the substrate 12 with a die attach adhesive 30, and die pads of the IC dice 28 are electrically connected to the vias 24 in the substrate 12 with a plurality of bonding wires 32 such that the IC dice 28 are connected to the electrically conductive pattern 16. A molding operation is performed to encapsulate the IC dice 28 and the bonding wires 32 with a mold compound 34.

The IC dice 28 may be any type of circuit such as, for example, a digital signal processor (DSP) or a special function circuit. The IC dice 28 are not limited to a particular technology such as CMOS, or derived from any particular wafer technology. Further, the present invention can accommodate IC dice 28 of various sizes; for example, the IC dice 28 may be between about 0.5 mm by 0.5 mm and about 20 mm by 20 mm in size. The IC dice 28 may be attached to the respective die attach areas on the substrate 12 by dispensing the die attach adhesive 30 onto the respective bonding sites on the substrate 12, placing the IC dice 28 on the respective bonding sites, and then curing the die attach adhesive 30. The die attach adhesive 30 may be a non-conductive liquid epoxy or a tape epoxy. Such epoxies are known in the art and commercially available.

The bonding wires 32 may be made of gold (Au), copper (Cu), aluminium (Al) or other electrically conductive materials as are known in the art and commercially available. A known wire bonding process may be used to form the electrical connections.

A well known molding process such as, for example, injection molding may be used to encapsulate the IC dice 28 and the bonding wires 32. The mold compound 34 may comprise well known commercially available molding materials such as plastic or epoxy.

Figure 4:
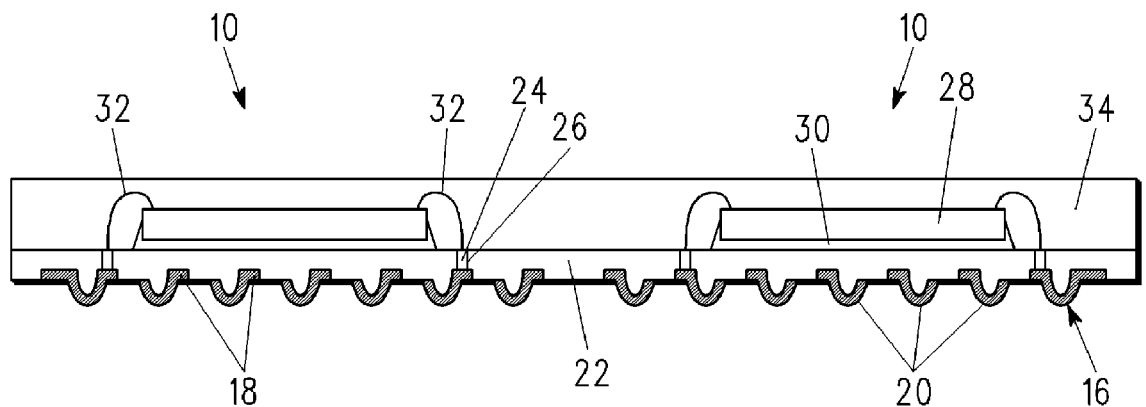
FIG. 4 is an enlarged cross-sectional view showing the semiconductor packages of FIG. 3 after removal of the substrate.

Referring now to FIG. 4, the substrate 12 is removed from the semiconductor packages 10 of FIG. 3 as shown, thereby exposing the electrically conductive pattern 16.

The substrate 12 may be removed using a known chemical etching process. For example, an ammoniac solution that dissolves only copper (Cu) may be used as an etchant to remove a substrate 12 made of copper.

The exposed conductive bumps 20 function as controlled collapse chip carrier connection (C5) bumps on the semiconductor packages 10. This eliminates the need for an additional processing step of attaching C5 solder balls to the semiconductor packages 10 during backend assembly. The elimination of a step in the manufacturing process translates into cost savings and fewer reliability issues. Moreover, because the bumps 20 are built up from the start of the manufacturing process and incorporated as part of the semiconductor packages 10, solder ball drop issues are also thus eliminated.

Further advantageously, the electrically insulating layer 22 functions as a stress relief layer, providing stress relief, for example, during thermal cycling after attachment of the semiconductor package 10 to a chip carrier. This reduces stresses on the C5 joints and thus improves board joint reliability. The electrically insulating layer 22 also absorbs some of the mechanical stress and strain on the bumps 20 during electrical testing, reducing the direct force impact imparted by a test socket.

In the embodiment shown, each of the bumps 20 is formed with a rounded base. Advantageously, the rounded base of the bumps 20 provides a self centering effect during attachment of the bumps 20 to respective pads of a chip carrier. It should however be understood that the present invention is not limited by the shape of the bumps 20. The bumps 20 may be shaped differently depending on the method by which the cavities 14 in the substrate 12 are formed.

Figure 5:
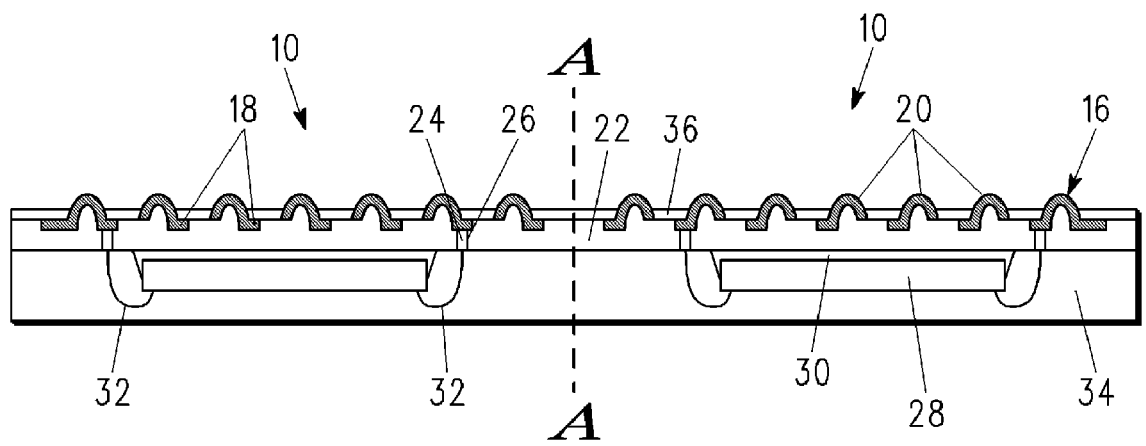
FIG. 5 is an enlarged cross-sectional view showing a second electrically insulating layer formed over a portion of the exposed electrically conductive pattern of FIG. 4.

Referring now to FIG. 5, a second electrically insulating layer 36 is formed over a portion of the exposed electrically conductive pattern 16 of FIG. 4 as shown. More particularly, the second electrically insulating layer 36 is formed over the exposed traces 18. As shown in FIG. 5, the semiconductor packages 10 of FIG. 4 are flipped or turned over for the formation of the second electrically insulating layer 36. A singulating operation such as, for example, saw singulation may subsequently be performed to separate adjacent ones of the IC dice 28 along vertical line A-A to form individual semiconductor packages 10.

The second electrically insulating layer 36 may, in one embodiment, be formed by forming a solder resist layer over the electrically conductive pattern 16 via film lamination and subsequently subjecting the solder resist layer to an exposure, development and thermal curing process to expose the bumps 20.

Although FIGS. 1 to 5 show the formation of only two (2) semiconductor packages 10, it will be understood that more than two semiconductor packages 10 may be formed simultaneously with the present invention.

Figure 6:
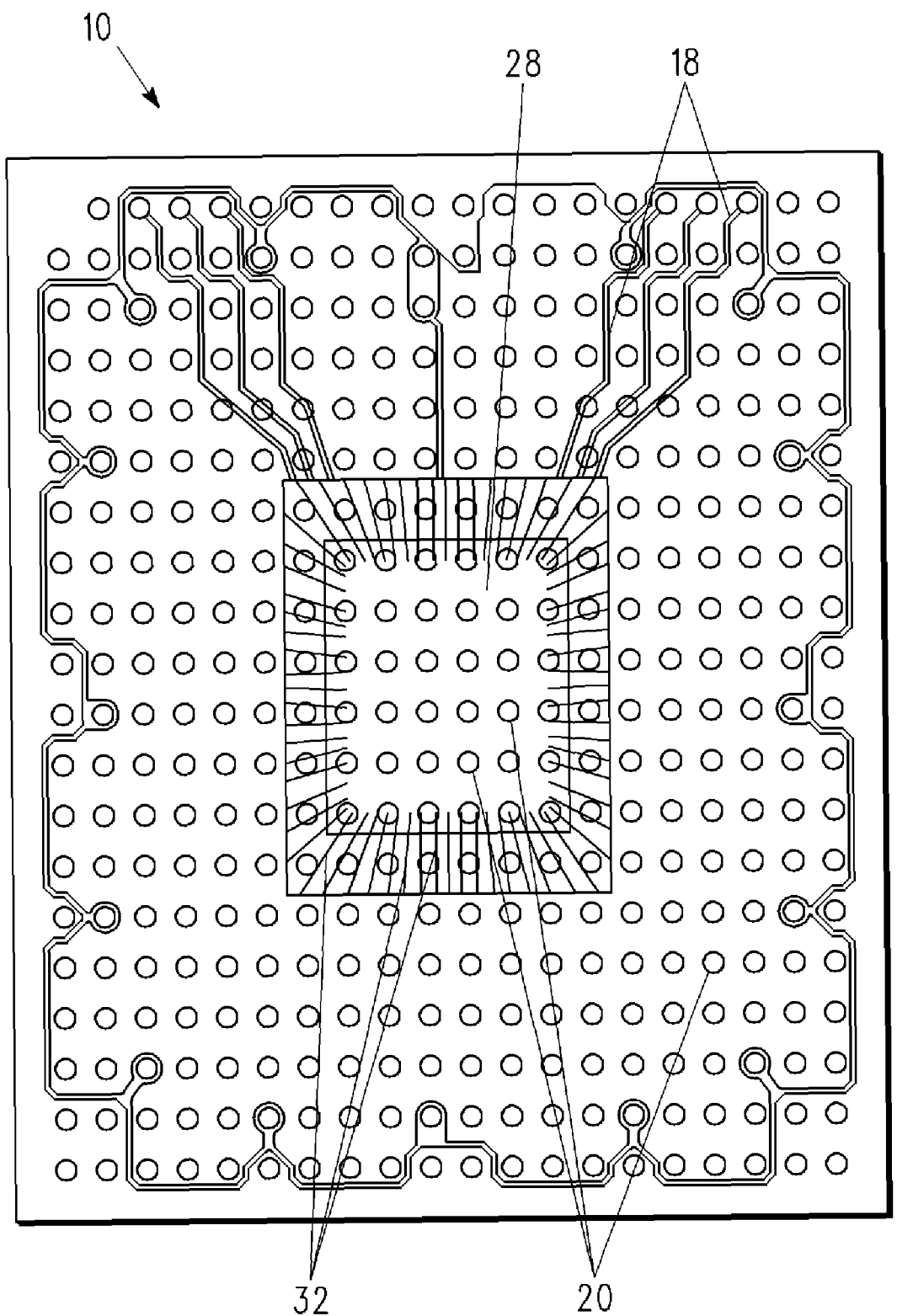
FIG. 6 is an enlarged schematic plan view of a semiconductor package in accordance with an embodiment of the present invention.

Referring now to FIG. 6, an enlarged schematic plan view of one of the semiconductor packages 10 of FIG. 5 is shown. As can be seen from FIG. 6, the conductive bumps 20 of the semiconductor package 10 are located on a central portion and a peripheral portion of the semiconductor package 10. Nonetheless, it should be understood that the present invention is not limited to full area array packages. In alternative embodiments, the conductive bumps 20 may, for example, be formed only around a peripheral portion of the semiconductor package 10.

A portion of the traces 18 extends between respective ones of the vias 24 and respective ones of the conductive bumps 20 located on the central portion of the semiconductor package 10. By routing the traces 18 in this manner, input/output (IO) points may be provided directly beneath the IC die 28. This increases IO count and IO density of the semiconductor package 10.

The conductive bumps 20 may have a pitch of between about 0.1 mm and about 1.0 mm and a diameter of between about 0.1 mm and about 1.0 mm. Nonetheless, it should be understood that the invention is not limited by the diameter of or pitch between the conductive bumps 20. Semiconductor packages 10 with fine pitch interconnects are thus achievable via the build up method described with reference to FIGS. 1 through 5. Advantageously, the fine pitch BCC bumps 20 enable smaller package footprints and/or high IO density.

As is evident from the foregoing discussion, the present invention provides a method of forming semiconductor packages with increased IO densities. Additionally, because the C5 bumps are incorporated as part of the semiconductor package, an additional step of C5 solder ball attach at the assembly backend may be eliminated, along with any solder ball drop issues that may otherwise arise. Further advantageously, the insulation film formed over the C5 bumps provides stress relieve to the C5 bumps during electrical testing and also to the C5 joints during thermal cycling.

The description of the preferred embodiments of the present invention have been presented for purposes of illustration and description, but are not intended to be exhaustive or to limit the invention to the forms disclosed. The invention may be applied to all bumped chip carrier (BCC) and plastic ball grid array (PBGA) packages that require high IO density and reliable C5 solder joints. It will be appreciated by those skilled in the art that changes could be made to the embodiments described above without departing from the broad inventive concept thereof. For example, the invention is not limited to wire bond dice, but may also be used with flip chip dice. It is understood, therefore, that this invention is not limited to the particular embodiments disclosed, but covers modifications within the spirit and scope of the present invention as defined by the appended claims.

The invention claimed is:

1. A method of forming a semiconductor package, comprising:
   forming a plurality of cavities in a substrate;
   forming an electrically conductive pattern on the substrate and over the cavities;
   forming an electrically insulating layer over the substrate and the electrically conductive pattern;
   forming a plurality of vias in the electrically insulating layer;
   attaching an integrated circuit (IC) die to the electrically insulating layer;
   electrically connecting the IC die to the vias, thereby connecting the IC die to the electrically conductive pattern;
   performing a molding operation to encapsulate the IC die; and
   removing the substrate, thereby exposing the electrically conductive pattern.

2. The method of forming a semiconductor package according to claim 1, wherein the cavities are formed in the substrate in accordance with a predetermined land pattern for the semiconductor package.

3. The method of forming a semiconductor package according to claim 1, wherein the cavities are formed in a full area array layout on the substrate.

4. The method of forming a semiconductor package according to claim 1, wherein the electrically conductive pattern comprises a plurality of traces and a plurality of conductive bumps, each of the conductive bumps corresponding to respective ones of the cavities.

5. The method of forming a semiconductor package according to claim 4, wherein a portion of the traces extends between respective ones of the vias and respective ones of the conductive bumps located on a central portion of the semiconductor package.

6. The method of forming a semiconductor package according to claim 4, further comprising forming a second electrically insulating layer over the exposed traces.

7. The method of forming a semiconductor package according to claim 1, wherein the step of forming the vias in the electrically insulating layer comprises:
   forming a plurality of through-holes through the electrically insulating layer to the electrically conductive pattern.

8. The method of forming a semiconductor package according to claim 7, wherein the step of forming the vias in the electrically insulating layer further comprises:
   plating the through-holes with an electrically conductive material.

9. The method of forming a semiconductor package according to claim 1, wherein the electrically insulating layer comprises a solder resist layer.

10. The method of forming a semiconductor package according to claim 1, wherein the substrate comprises an electrically conductive material.

11. A method of forming a plurality of semiconductor packages, comprising:
    forming a plurality of cavities in a substrate;
    forming an electrically conductive pattern on the substrate and atop the cavities;
    forming an electrically insulating layer over the substrate and the electrically conductive pattern;
    forming a plurality of vias in the electrically insulating layer;
    attaching a plurality of integrated circuit (IC) dice to the electrically insulating layer;
    electrically connecting the IC dice to the vias, thereby connecting the IC dice to the electrically conductive pattern;
    performing a molding operation to encapsulate the IC dice; and
    removing the substrate, thereby exposing the electrically conductive pattern.

12. The method of forming a plurality of semiconductor packages according to claim 11, wherein the cavities are formed in the substrate in accordance with a predetermined land pattern for the semiconductor packages.

13. The method of forming a plurality of semiconductor packages according to claim 11, wherein the electrically conductive pattern comprises a plurality of traces and a plurality of conductive bumps, each of the conductive bumps corresponding to respective ones of the cavities.

14. The method of forming a plurality of semiconductor packages according to claim 11, wherein the step of forming the vias in the electrically insulating layer comprises:
forming a plurality of through-holes through the electrically insulating layer to the electrically conductive pattern.

15. The method of forming a plurality of semiconductor packages according to claim 14, wherein the step of forming the vias in the electrically insulating layer further comprises:
plating the through-holes with an electrically conductive material.

16. A method of forming a semiconductor package, comprising:
forming a plurality of cavities in a substrate;
forming an electrically conductive pattern on the substrate and over the cavities;
forming an electrically insulating layer over the substrate and the electrically conductive pattern;
forming a plurality of through-holes through the electrically insulating layer to the electrically conductive pattern;
plating the through-holes with an electrically conductive material to form a plurality of vias in the electrically insulating layer;
attaching an integrated circuit (IC) die to the electrically insulating layer;
electrically connecting the IC die to the vias with a plurality of bonding wires, thereby connecting the IC die to the electrically conductive pattern;
performing a molding operation to encapsulate the IC die and the bonding wires; and
removing the substrate, thereby exposing the electrically conductive pattern.

17. The method of forming a semiconductor package according to claim 16, wherein the cavities are formed in the substrate in accordance with a predetermined land pattern for the semiconductor package.

18. The method of forming a semiconductor package according to claim 16, wherein the cavities are formed in a full area array layout on the substrate.

19. The method of forming a semiconductor package according to claim 16, wherein the electrically conductive pattern comprises a plurality of traces and a plurality of conductive bumps, each of the conductive bumps corresponding to respective ones of the cavities.

20. The method of forming a semiconductor package according to claim 19, wherein a portion of the traces extends between respective ones of the vias and respective ones of the conductive bumps located on a central portion of the semiconductor package.

* * * * *